(12) United States Patent
Sakumoto

(10) Patent No.: US 7,503,676 B2
(45) Date of Patent: Mar. 17, 2009

(54) LIGHT-EMITTING DEVICE AND ILLUMINATING APPARATUS

(75) Inventor: Daisuke Sakumoto, Higashiomi (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 11/828,775

(22) Filed: Jul. 26, 2007

(65) Prior Publication Data

US 2008/0049430 A1 Feb. 28, 2008

(30) Foreign Application Priority Data

Jul. 26, 2006 (JP) ............................. 2006-203305

(51) Int. Cl.
*F21V 9/00* (2006.01)
(52) U.S. Cl. ..................... 362/293; 362/231; 362/800
(58) Field of Classification Search .................. 362/84, 362/231, 243, 293, 310, 311, 800; 313/501, 313/502, 512; 257/98, 100
See application file for complete search history.

(56) References Cited

U.S. PATENT DOCUMENTS

| 2006/0163601 | A1* | 7/2006 | Harle et al. | 257/100 |
| 2006/0170335 | A1* | 8/2006 | Cho et al. | 313/501 |
| 2007/0012940 | A1* | 1/2007 | Suh et al. | 257/98 |

FOREIGN PATENT DOCUMENTS

| JP | 2004-031989 | | 1/2004 |
| JP | 2005268323 A | * | 9/2005 |
| JP | 2006286701 A | * | 10/2006 |

* cited by examiner

*Primary Examiner*—Y My Quach Lee
(74) *Attorney, Agent, or Firm*—Ditthavong Mori & Steiner, P.C.

(57) ABSTRACT

A light-emitting device has a base, a light-emitting chip and a light emitter. The light-emitting chip is made of semiconductor material, and is mounted on the base. The light-emitting chip generates the primary light. The light emitter includes fluorescent material being excited by the primary light to emit a secondary light. The light emitter has a first surface with uneven surface texture.

21 Claims, 15 Drawing Sheets

LIGHT-EMITTING DEVICE AND ILLUMINATING APPARATUS

CROSS-REFERENCE TO RELATED APPLICATIONS

The present application claims priority under 35 U.S.C. §119 to Japanese Patent Application No. 2006-203305, filed Jul. 26, 2006. The contents of the application are incorporated herein by reference in its entirety.

BACKGROUND

1. Field of the Invention

The present invention relates to a light-emitting device having a light emitter including a fluorescent material, and an illuminating apparatus.

2. Description of the Related Art

Recently, the improvement of a light-emitting device and an illuminating apparatus comprising a light-emitting chip such as a light-emitting diode has been progressed. Some light-emitting devices and some illuminating apparatuses, include a light emitter which contains fluorescent material to be excited by the light emitted from a light-emitting chip. The light-emitting device and the illuminating apparatus emit composite output light comprising the light emitted from the light emitter. As to the light-emitting device and the illuminating apparatus comprising a light-emitting chip, the improvement of light-emitting efficiency has been required. Especially, as to the light-emitting device and the illuminating apparatus comprising the light emitter, the improvement of emitting efficiency of light by the light emitter has been required.

SUMMARY OF THE INVENTION

According to one aspect of the present invention, a light-emitting device has a base, a light-emitting chip and a light emitter. The light-emitting chip made of semiconductor material is mounted on the base. The light-emitting chip generates the primary light. The light emitter includes a fluorescent material that be excited by the primary light to emit a secondary light. The light emitter has a first surface of uneven surface texture facing to the light-emitting chip.

According to another aspect of the present invention, a light-emitting device has a light source and a wavelength-conversion means. The light source generates a primary light having a first wavelength. The wavelength-conversion means has a first surface of uneven surface texture. A wavelength converter emits a secondary light having a second wavelength different from the first wavelength depending on the primary light.

According to further aspect of the invention, an illuminating apparatus has a substrate, a light-emitting chip and a light emitter. The substrate has conductive pattern. The light-emitting chip made of semiconductor material is electrically connected to the conductive pattern. The light emitter includes a fluorescent material, and has a first surface of uneven surface texture facing to the light-emitting chip. The light emitter covers a light-emitting chip.

DESCRIPTION OF THE PREFERRED EMBODIMENTS

Figure 1:
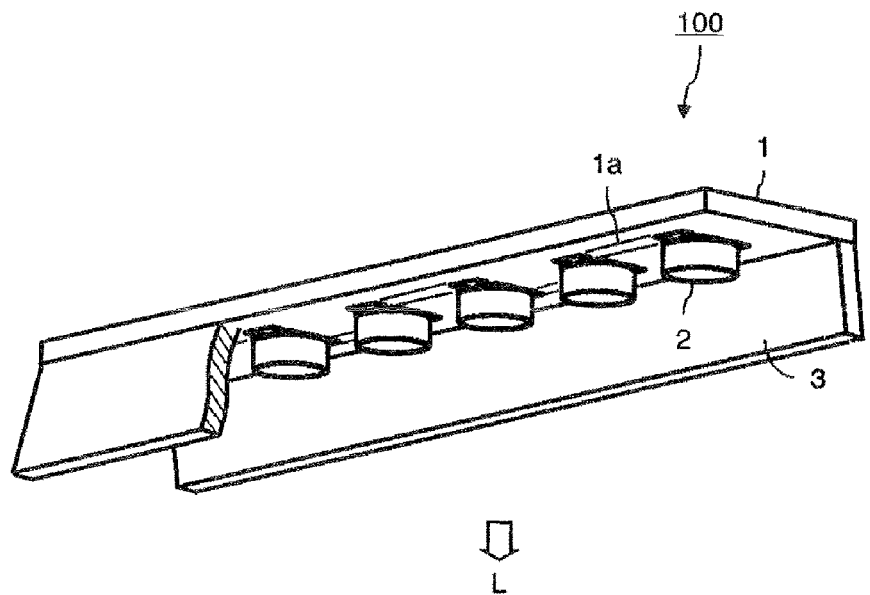
FIG. 1 is a perspective view for illustrating an embodiment of an illuminating apparatus according to the present invention.

Hereinafter, an exemplary embodiment of the present invention is explained in detail with reference to the drawings. An embodiment of an illuminating apparatus according to the present invention illustrated in FIG. 1 is explained. In FIG. 1, the illustration about a part of the structure is omitted so as to represent the inside structure of an illuminating apparatus 100. The illuminating apparatus 100 has a substrate 1, a plurality of light-emitting devices 2 mounted on the substrate 1, and a light reflector 3. The light reflector 3 is installed in the location where at least a part of the light generated by the plurality of light-emitting devices 2 reaches. In FIG. 1, the light reflector 3 is installed in the side of the plurality of light-emitting devices 2. The plurality of light-emitting devices 2 is arranged, and is connected electrically to conductive pattern 1a formed on the substrate 1. The plurality of light-emitting devices 2 emits light by the driving electric power supplied through the conductive pattern 1a. The plurality of light-emitting devices 2 emits visible light of white, for example. The light emitted from the plurality of light-emitting devices 2 advances to the light-outputting direction L (the lower direction in FIG. 1) by being condensed by the light reflector 3.

Figure 2:
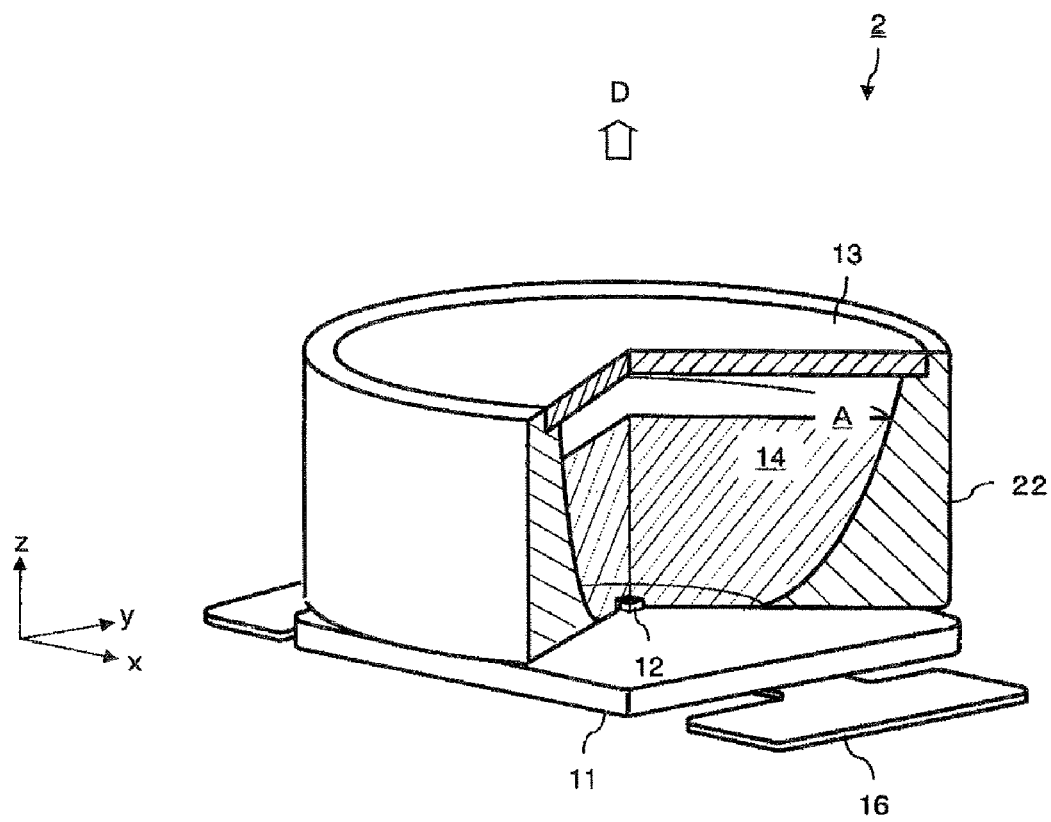
FIG. 2 is a perspective view for illustrating an embodiment of a light-emitting device according to the present invention.

Referring to FIG. 2 shall explain the structure of the light-emitting device 2 more completely hereon. The light-emitting device 2 mounted on XY plane in virtual XYZ space as illustrated in the FIG. 2. The light-emitting device 2 has a base 11, a light-emitting chip (light source) 12 mounted on the base 11, and a light emitter (a wavelength converter) 13 covering the light-emitting chip 12. In the present embodiment, the term, "covering the light-emitting chip 12" means that the wavelength converter 13 is disposed in the location where at least a part of the light generated by the light-emitting chip 12 reaches. In FIG. 2, the wavelength converter 13 is located in the upper side (the original direction of virtual Z axis) of the light-emitting chip 12. The light-emitting device 2 further has a transparent material layer 14 encapsulating the light-emitting chip 12.

Figure 3:
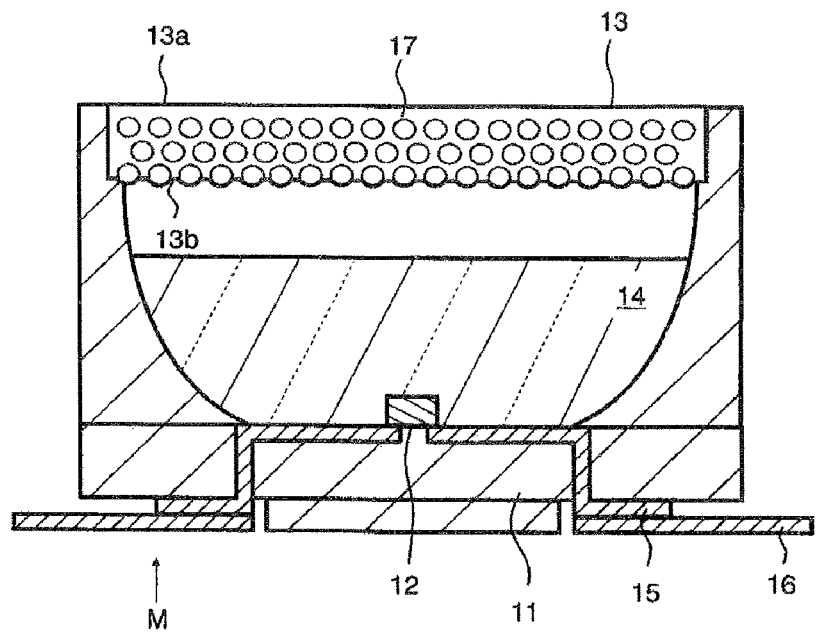
FIG. 3 is a sectional view of the light-emitting device illustrated in FIG. 2.

The light-emitting chip 12 is a light-emitting diode made of semiconductor material, and generates a primary light by driving electric power. A light-emitting diode, as an example, has P-type GaN layer, GaN active layer, and N-type GaN layer formed on a substrate. As another example of a light-emitting diode, one made of AlN. In the present embodiment, the primary light has at least a part of the wavelength range from 370 nm to 400 nm (ultraviolet) or at least a part of the wavelength range from 420 nm to 440 nm (blue). Hereinafter, the light-emitting chip 12 of the present embodiment shall be explained as a light-emitting diode that generates ultraviolet light. The light-emitting chip 12 is mounted on the base 11. The base 11 supports the light-emitting diode 12. As illustrated in FIG. 3, the base 11 has conductive pattern 15 connected electrically to the light-emitting chip 12. The conductive pattern 15 is connected electrically to a plurality of lead terminals 16 located on the mounting surface M of the base 11. The plurality of lead terminals 16 is connected electrically to the conductive pattern 1a of the substrate 1 illustrated in the FIG. 1. Another example of the base is made of resin or metal. The base made of metal, for example, may include the function of conductive pattern. In the illuminating apparatus 100, the light-emitting chip 12 is electrically connected to the conductive pattern 1a of the substrate 1.

The wavelength converter 13 includes fluorescent material 17 being excited by the primary light generated by the light-emitting chip 12 to emit a secondary light. Wavelength of the secondary light is longer than that of the primary light. The wavelength converter 13 has an outer surface (a second surface) 13a and an inner surface (a first surface) 13b. The inner surface 13b is rougher than the outer surface 13a. The outer surface 13a is the outgoing surface of the light emitted from fluorescent material 17 in the light-emitting device 2. That is, the outer surface 13a is a light-emitting surface in the light-emitting device 2. In FIG. 3, the outer surface 13a is a top surface of the wavelength converter 13. The inner surface 13b means the surface where the primary light emitted from a light-emitting chip 12 enters. In FIG. 3, the inner surface 13b is a bottom surface of the wavelength converter 13.

The wavelength converter 13 is made of resin containing the fluorescent material 17. The resin is transparent. The transparency of resin means that the resin transmits at least a part of the wavelength of the primary light generated by the light-emitting chip 12. It is desirable for the transparent resin to be manufactured using gel-type silicone resin, in consideration of degradation due to the light generated by the light-emitting chip 12, or the manufacturing method of the wavelength converter 13, etc. Also, in the light-emitting device 2 of the present embodiment, it is desirable to use gel-type silicone resin, though there are gel-type silicone resin and rubber-type silicone resin as silicone resins. In the present embodiment, gel-type silicone resin means silicone resin of which the value of JIS-A hardness as JIS (Japanese Industrial Standard) standard is 30 to 40. while rubber-type silicone resin means silicone resin of which the value of JIS-A hardness is 50 to 90. In the present embodiment, gel-type silicone resin of the wavelength converter 13 has the specific gravity included within range from 0.9 to 1.1.

Figure 4:
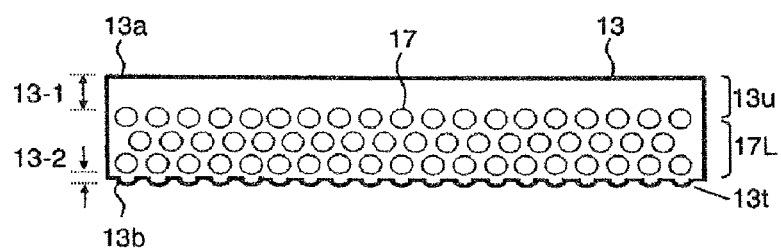
FIG. 4 is a schematic diagram of a wavelength converter.
Figure 5:
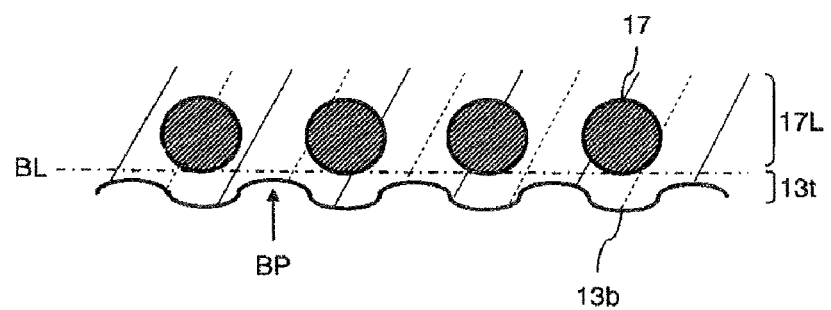
FIG. 5 illustrates a structure of an inner surface 13b in a wavelength converter 13.

As illustrated in FIG. 4, the fluorescent material 17 is unevenly distributed to the inner surface 13b side of the wavelength converter 13. In the wavelength converter 13, the thickness of a transparent resin layer 13t located in the inner surface 13b side of the fluorescent material layer 17L is thinner than that of a transparent resin layer 13u located in the outer surface 13a side of the fluorescent material 17L. The resin of the wavelength converter 13 has the first thickness 13-1 located in the outer side than the outer-most fluorescent material 17 and the second thickness 13-2 located in the inner side than the inner-most fluorescent material 17. The second thickness 13-2 is thinner than the first thickness 13-1. The surface texture (surface roughness) of the inner surface 13b in the wavelength converter 13 results from the fluorescent material 17 of a particle-shape having the particle diameter included within range from 0.1 μm to 100 μm. That is, the fluorescent material 17 is unevenly distributed so that the inner surface 13b of the wavelength converter 13 is roughened. Referring to FIG. 5 shall explain the surface texture of the inner surface 13b in the wavelength converter 13 hereon. The wavelength converter 13 has the uneven inner surface 13b. The inner surface 13b has configuration depending on the shape of the inner-most fluorescent material 17. The wavelength converter 13 has uneven structure in the lower side than the bottom location BL of the inner-most fluorescent material 17. That is, the wavelength converter 13 has uneven structure in the transparent material layer 13t located in the inner surface 13b side of fluorescent material 17L. A Bottom portion BP of relief in the inner surface 13b is located more inside than bottom location BL of the inner-most fluorescent material 17.

The definition of surface roughness (surface texture) is defined by ISO 4287 (International Standard): 1997 (JIS B 0601: 2001). The arithmetic mean roughness Ra that is defined here is represented by the formula below.

$$Ra = \frac{1}{lr} \int_0^{lr} |Z(x)| \, dx$$

Here, lr is the standard length, Z(x) is the height corresponding to the position (x) of roughness curve in the ordinate value. In the present invention, roughness is defined by the arithmetic mean roughness Ra. As for the methods of measuring roughness, there is a method that directly measures the surface of the wavelength converter 13 with a contact needle, and a method that indirectly measures without contact with the surface of the wavelength converter 13. In the present embodiment, the method measuring without contact is adopted considering such as the properties of wavelength converter 13 materials.

The wavelength converter 13 is apart from the light-emitting chip 12. In the present embodiment, the term, "being apart from the light-emitting chip 12" means that the wavelength converter 13 is arranged at intervals with the light-emitting chip 12. The wavelength converter can have another member as an interposer or nothing between the wavelength converter 13 and the light-emitting chip 12. In FIG. 2, the wavelength converter 13 is arranged at intervals with the light-emitting chip 12 by interposing a transparent material layer 14 between the wavelength converter 13 and the light-emitting chip 12. The unevenness of light-emitting strength distribution in the light-emitting device 2 has been reduced because the wavelength converter 13 is alienated from the light-emitting chip 12.

Fluorescent material 17 shall be explained hereon. Here, a structure of using a light-emitting diode that generates ultraviolet light as the light-emitting chip 12 shall be explained. For example, in order to output composite light of white from the light-emitting device 2, it is desirable for the fluorescent material 17 to have a specific gravity included within range from 3.8 to 5.1 described as follows, considering the relation with the wavelength of ultraviolet light, the manufacturing method of the wavelength converter 13 and so on. Specifically, it is desirable for the fluorescent material to be made by the combination of RGB fluorescent materials selected respectively from the groups of R, G, and B as follows.

The followings are illustrated for the red R fluorescent material.

$Y_2O_2S$:Eu
$Y_2O_3$:Eu
$YVO_4$:Eu
$SrCaS$:Eu

The followings are illustrated for the green G fluorescent material.

ZnS:Cu, Al
$Y_3Al_5O_{12}$:Tb
$Y_3(Al, Ga)_5O_{12}$:Tb
$Y_2SiO_5$:Tb
$Zn_2SiO_4$:Mn
ZnS:Cu
$(Sr, Eu)Al_2O_4$

The followings are illustrated for the blue B fluorescent material.

ZnS:Ag
ZnS:Ag, Al
ZnS:Cu
ZnS:Cl
$(Ba, Eu)MgAl_{10}O_{17}$
$(Sr, Ca, Ba, Mg)_{10}(PO_4)_6Cl_2$:Eu
$(Ba, Sr, Eu)(Mg, Mn)Al_{10}O_{17}$

The wavelength converter 13 is formed by pouring the mixture containing the fluorescent material 17 in a transparent resin as the base material, into a sheet-shaped mold made of glass, for example, and then by punching the hardened mixture to have a predetermined shape. A sheet with the bottom surface rougher than the top surface can be obtained by precipitating the fluorescent material 17 in the mixture before the mixture of the transparent resin and the fluorescent material 17 is hardened. The bottom surface of the sheet is rougher than the top surface due to the precipitation of the fluorescent material 17. In the light-emitting device 2 illustrated in FIG. 3, the bottom surface of the sheet of the mixture is arranged to be located in the near side from the light-emitting chip 12, and the top surface of the sheet of the mixture is installed to be located in the far side from the light-emitting chip 12. That is, the bottom surface of the sheet of the mixture corresponds to the inner surface 13b of the wavelength converter 13, and the top surface of the sheet of the mixture corresponds to the outer surface 13a of the wavelength converter 13. The inner-most fluorescent material 17 of the wavelength converter 13 emits at least a part of the wavelength range from 625 nm to 740 nm (red).

Figure 6:
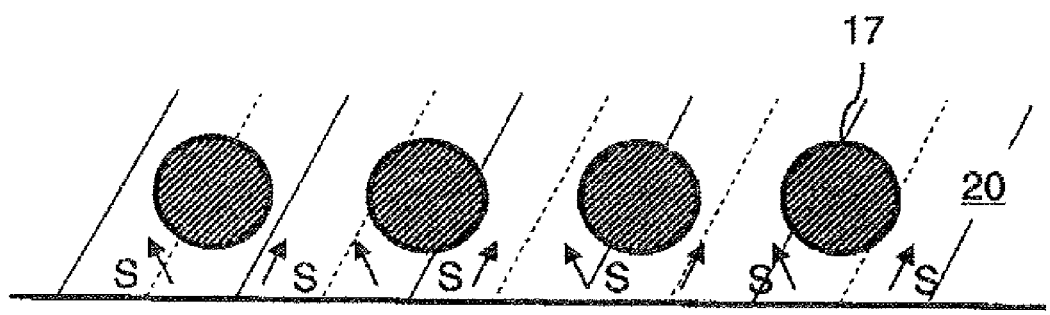
FIG. 6 illustrates a manufacturing method of a wavelength converter 13.

Referring FIG. 6 shall explain the surface texture in the bottom surface of the sheet (the inner surface 13b of the wavelength converter 13) composed of the mixture of the fluorescent material 17 and the transparent resin in further details. The sheet made of the mixture can be obtained by subjecting the mixture of a transparent resin 20 in melt state and the fluorescent material 17 to a heating process of 2-3 minutes at 150° C., for example. In the heating process, the transparent resin 20 becomes a semi-hardened state (B stage state). Stress is generated to the direction represented with the arrow S in FIG. 6 due to the relation with the fluorescent material 17 being precipitated when the transparent resin 20 is hardened. When the sheet made of the semi-hardened mixture is separated from the mold, the bottom surface of the sheet is deformed to the direction of the arrow S by being freed from the restriction by the mold. In this way, the mixture sheet with the uneven bottom surface can be obtained as illustrated in FIG. 5.

The light-emitting device 2 further has a transparent material layer 14 which is in contact with the sides of the light-emitting chip 12. In the present embodiment, the transparency of the layer 14 means that at least a part of the wavelength of the light generated by the light-emitting chip 12 can be transmitted. In the structure illustrated in FIG. 2, the transparent material layer 14 is adhered to the top and the sides of the light-emitting chip 12. The transparent material layer 14 is made by hardening after filling to an opening A of a package composed of the base 11 and a reflector 22. The transparent material layer 14 is made of resin such as silicone resin. The top surface of the transparent material layer 14 is apart from the wavelength converter 13. The light emitted downward from the fluorescent material 17 is apt to be reflected upward on the interface between the wavelength converter 13 and an air layer.

Figure 7:
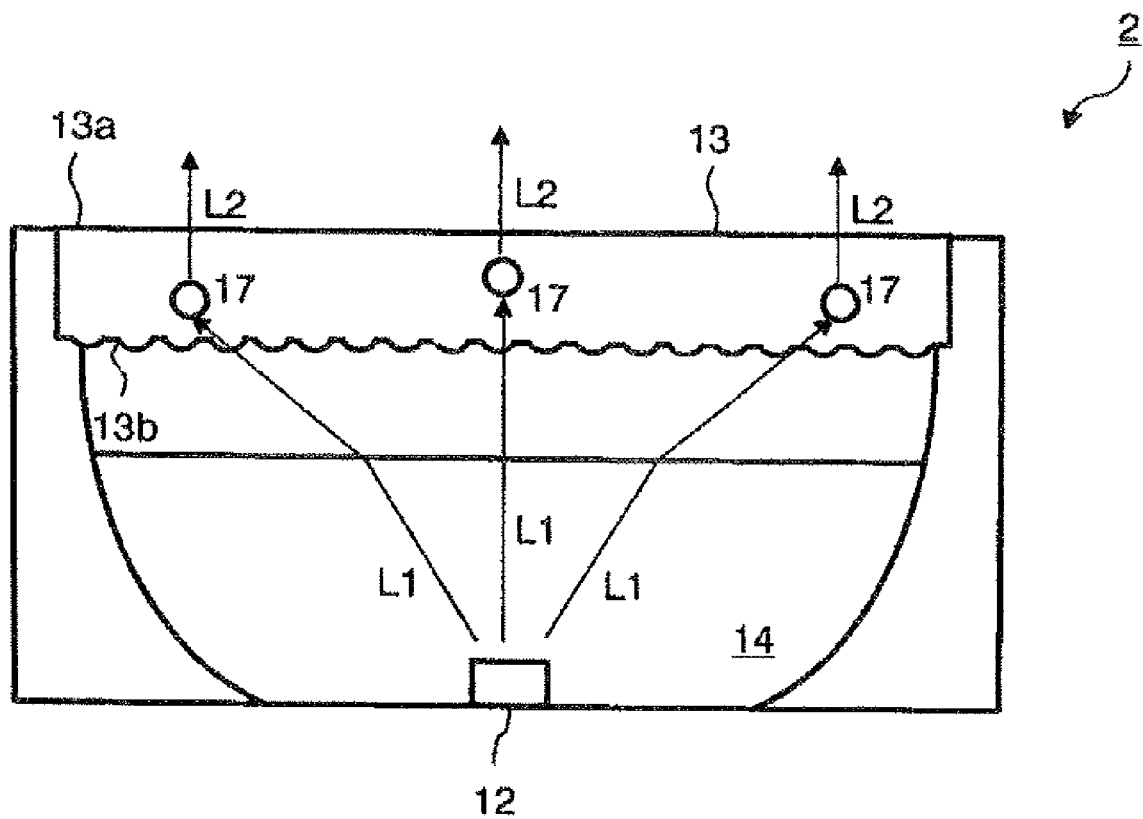
FIG. 7 is a schematic diagram illustrating how the light travels in the light-emitting device shown in FIG. 3.

Referring to FIG. 7 shall explain how the light travels in the light-emitting device 2 of the present embodiment. The light-emitting device 2 has a space between the wavelength converter 13 and the transparent material layer 14. In this space, there is a material (for example, air of which the refractive index of light is 1) of which the refractive index is smaller than that of the base material in the wavelength converter 13. In the light-emitting device 2 of the present embodiment, the base material of the wavelength converter 13 is made of silicone resin of which the refractive index of light is approximately 1.4. The primary light L1 is generated by the light-emitting chip 12 and travels to the direction of the wavelength converter 13 (upward in FIG. 7) by transmitting the transparent material layer 14. The primary light L1 transmits the inner surface 13b of the wavelength converter 13. The primary light enters to the silicone resin from the air (namely, from the smaller refractive index to the larger refractive index). The wavelength of the primary light L1 is converted by the fluorescent material 17. The secondary light L2 emitted from the fluorescent material 17 is outputted from the silicone resin to the air (namely, from the larger refractive index to the smaller refractive index) through the outer surface 13a of the wavelength converter 13. Generally, when light transmits between materials that respectively have different refractive indexes, it is easier for the total reflection of light to occur, in case that the light transmits from the larger refractive index to the smaller refractive index in comparison to the case that the light transmits from the smaller refractive index to the larger refractive index. When the primary light L1 transmits the inner surface 13b, it is relatively difficult for the total reflection to occur. The inner surface 13b has a relatively large surface area due to uneven surface texture. In the light-emitting device 2 provided with this structure, the amount of the primary light transmitting the inner surface 13b is increased. In the light-emitting device 2, the total reflection of light in a specific area of the inner surface 13b is decreased because the inner surface 13b which faces to the light-emitting chip 12 has uneven surface texture.

Figure 8A:
FIG. 8A is a perspective view illustrating a second surface of a wavelength converter.
Figure 8B:
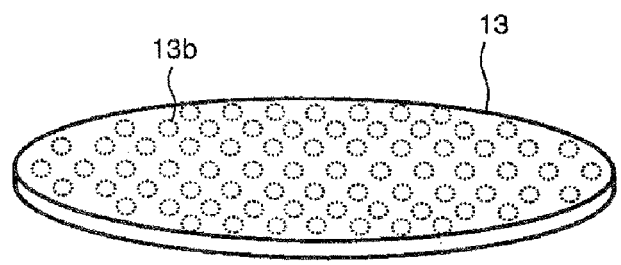
FIG. 8B is a perspective view illustrating an inner surface.
Figure 9:
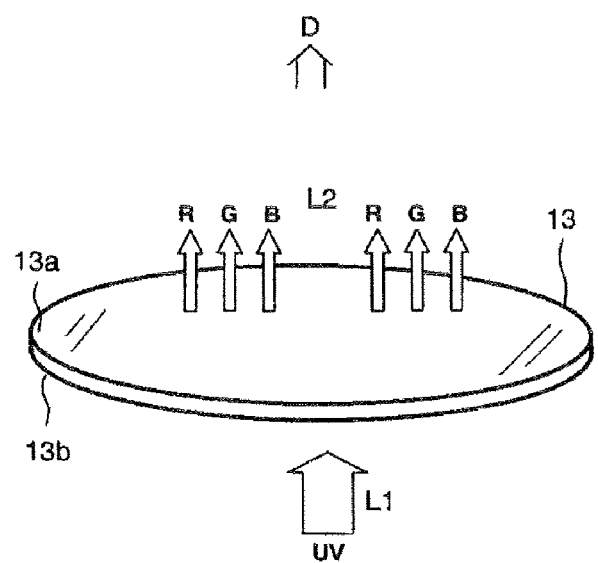
FIG. 9 is a schematic diagram illustrating the conversion of wavelength in a wavelength converter.

As illustrated in FIG. 8A and FIG. 8B, the surface of the inner surface 13b in the wavelength converter 13 is rougher than the outer surface 13a. The surface area of the inner surface 13b is larger than that of the outer surface 13a. In this way, the inner surface 13b of the wavelength converter 13 where the total reflection of light is relatively difficult to occur is formed to have a larger surface area than that of the outer surface 13a of the wavelength converter 13 where the total reflection of light is relatively easy to occur. That is, the area of the boundary where the entrance index of light is relatively high, is larger than the area of the boundary where the entrance index of light is relatively low. Specifically, as illustrated in FIG. 9, the primary light L1 (ultraviolet UV) generated by the light-emitting chip 12 and emitted from the transparent material layer 14, reaches the fluorescent material through the inner surface 13b of the wavelength converter 13 where the total reflection of light is relatively difficult to occur and the surface area is formed relatively large. The secondary light L2 (red light R, green light G, blue light B) emitted from the fluorescent material by being excited by the primary light L1, is outputted toward the outside of the light-emitting device 2 (direction D) through the outer surface 13a of the wavelength converter 13 where the total reflection of light is relatively easy to occur and the surface area is formed relatively small. As the inner surface 13b of the wavelength converter 13 is rougher than the outer surface 13a of the wavelength converter 13, light-output of the light-emitting device 2 is enhanced.

Figure 10:
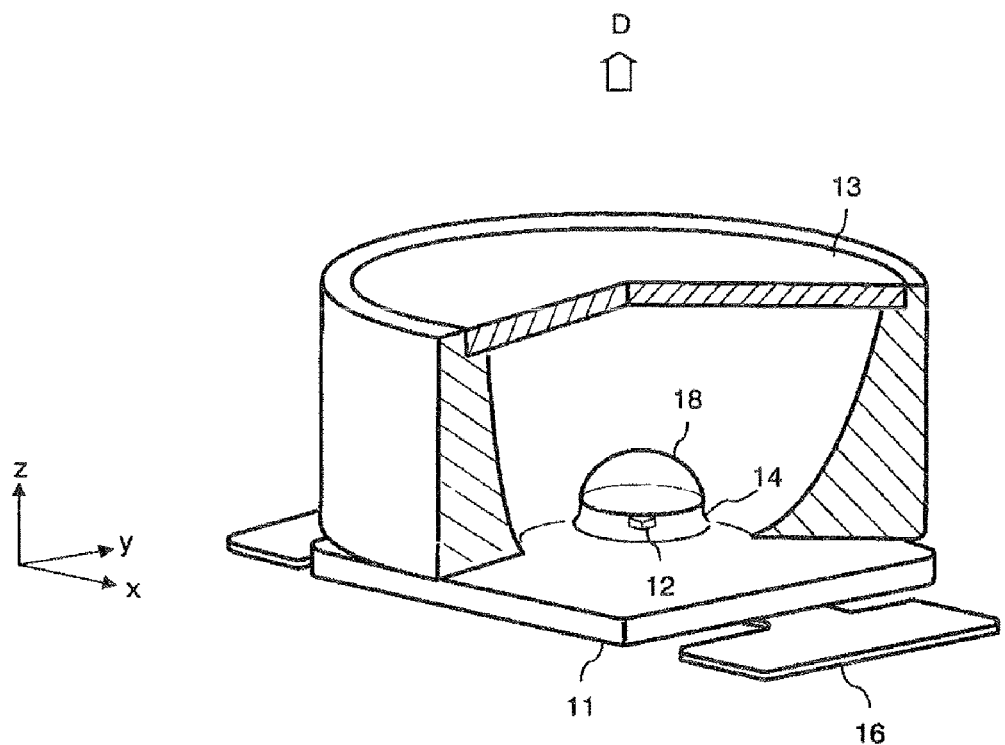
FIG. 10 is a perspective view illustrating another embodiment of a light-emitting device according to the present invention.
Figure 11:
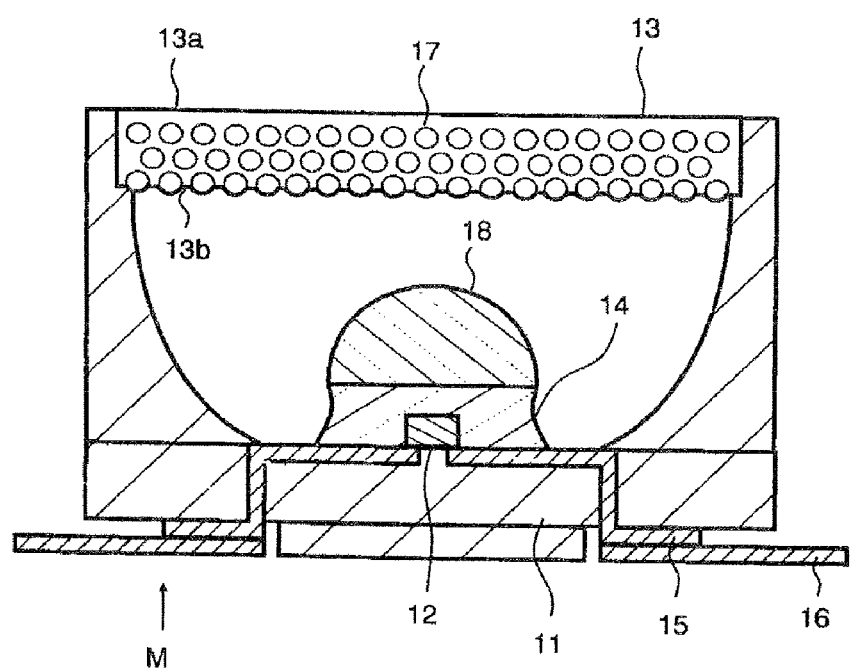
FIG. 11 is a sectional view of the light-emitting device illustrated in FIG. 10.
Figure 12:
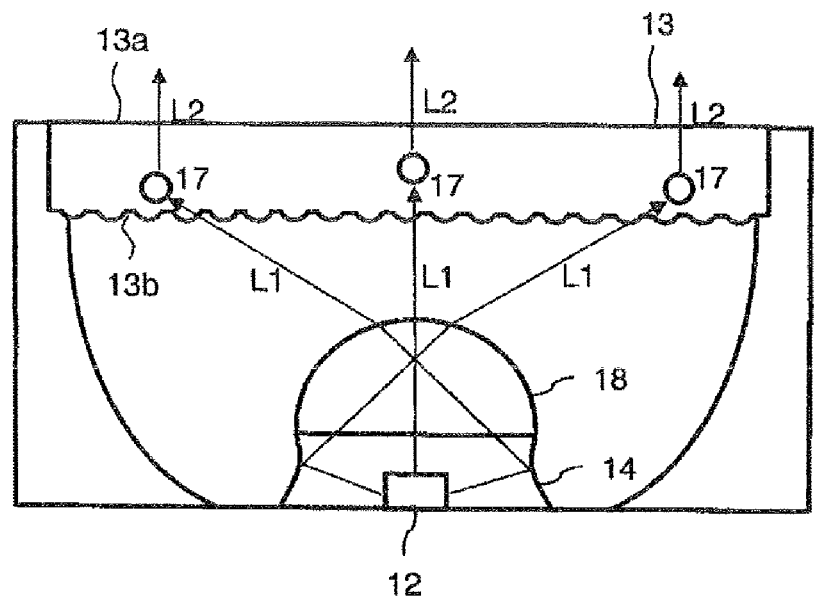
FIG. 12 is a schematic diagram illustrating how the light travels in the light-emitting device illustrated in FIG. 11.

Referring to FIG. 10 and FIG. 11 shall explain another embodiment of the light-emitting device 2. In the light-emitting device illustrated in FIG. 10, the difference from the structure of the light-emitting device 2 illustrated in FIG. 2 is that the light-emitting device illustrated in FIG. 10 is further has a lens 18 in contact with the transparent material layer 14. In the present embodiment, the same reference numeral is used in the same composition with the light-emitting device 2 illustrated in FIG. 2. The transparent material layer 14 is adhered to the sides and the top of the light-emitting chip 12. The transparent material layer 14 encapsulates the light-emitting chip 12. The lens 18 is adhered to the top of the transparent material layer 14. The lens 18 is made of a transparent material, and is previously formed. In the present embodiment, the transparency of the lens 18 means that at least a part of the wavelength of light generated by the light-emitting chip 12 can be transmitted. The lens 18 is made of glass or resin. The lens 18 diffuses the light generated by the light-emitting chip 12, thereby emitting to the wavelength converter 13.

Referring to FIG. 2 shall explain how the light travels in the light-emitting device of the present embodiment. The primary light L1 generated by the light-emitting chip 12 enters the lens 18 through the transparent material layer 14. The primary light L1 is emitted to the wavelength converter 13 by being diffused by the lens 18. The primary light L1 emitted to the wavelength converter 13 reaches the fluorescent material 17 through the roughened inner surface 13b of the wavelength converter 13. As the light-emitting device of the present embodiment is provided with the lens 18, the primary light L1 generated by the light-emitting chip 12 is diffused and reaches the wavelength converter 13. Thus, wavelength conversion efficiency in the wavelength converter 13 is improved.

Figure 13:
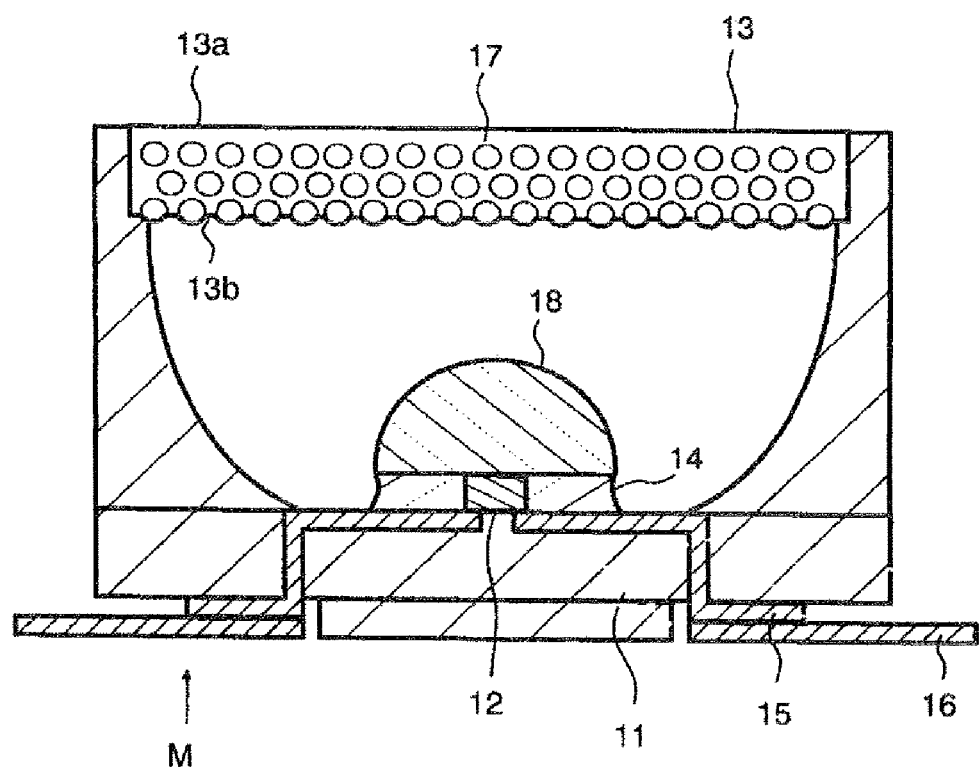
FIG. 13 is a sectional view illustrating another embodiment of a light-emitting device according to the present invention.

Referring to FIG. 13 shall explain another embodiment of a light-emitting device 2. In the light-emitting device illustrated in FIG. 13, the difference from the structure of the light-emitting device illustrated in FIG. 10 is that the lens 18 is in contact with the light-emitting chip 12. In the light-emitting device of the present embodiment, the same reference numeral is used in the same composition with the light-emitting device illustrated in FIG. 10. The transparent material layer 14 is adhered to the sides of the light-emitting chip 12. The lens 18 is adhered to the top of the transparent material layer 14.

Figure 14:
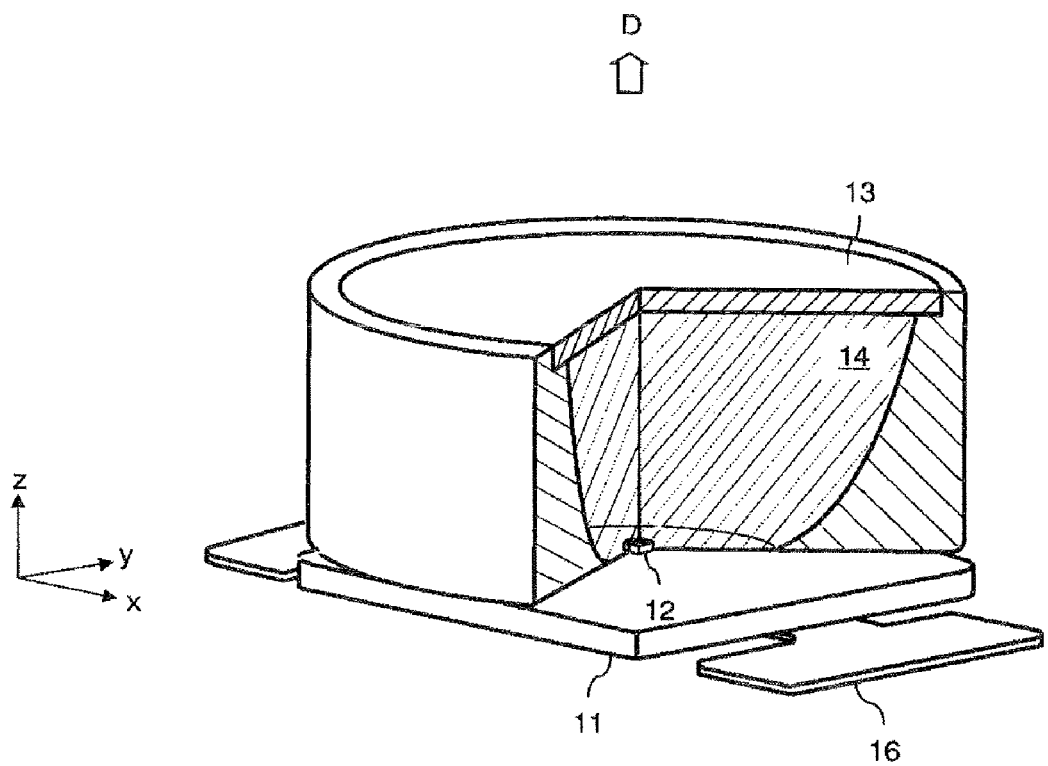
FIG. 14 is a sectional view illustrating another embodiment of a light-emitting device according to the present invention.
Figure 15:
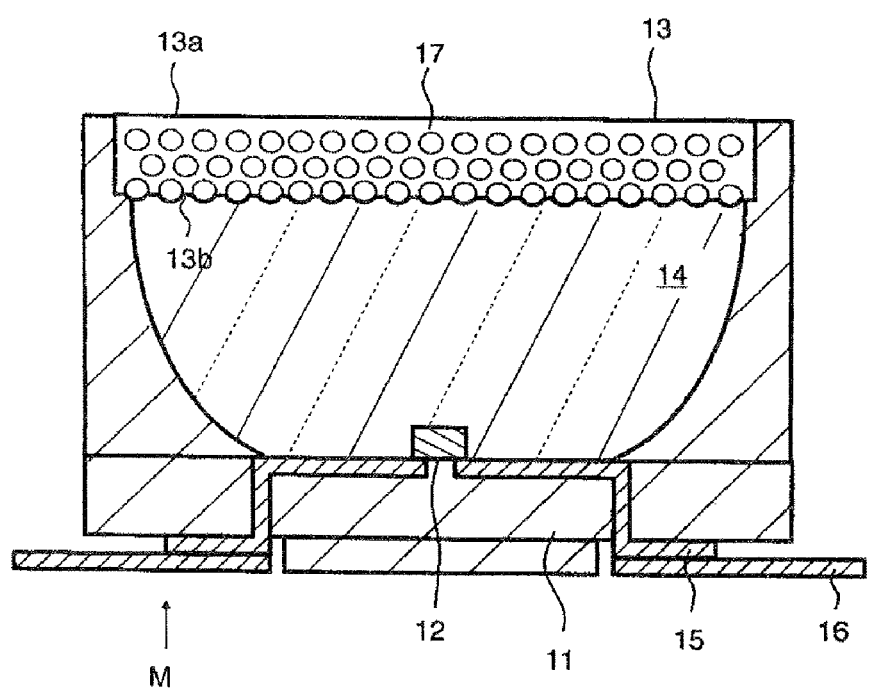
FIG. 15 is a sectional view of the light-emitting device illustrated in FIG. 14.
Figure 16:
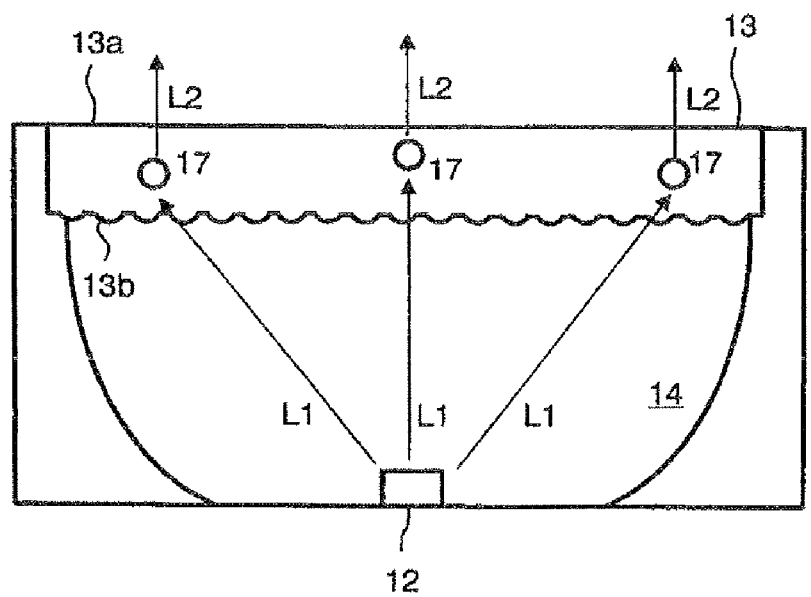
FIG. 16 is a schematic diagram illustrating how the light travels in the light-emitting device illustrated in FIG. 15.

Referring to FIG. 14 and FIG. 15 shall explain another embodiment of a light-emitting device 2. In the light-emitting device of the present embodiment, the difference from the structure of the light-emitting device 2 illustrated in FIG. 2 is that the wavelength converter 13 is in contact with the transparent material layer 14. The roughened inner surface 13b of the wavelength converter 13 is adhered to the top of the transparent material layer 14 encapsulating the light-emitting chip 12. In the light-emitting device of the present embodiment, the same reference numeral is used in the same composition with the light-emitting device shown in FIG. 2. In the present embodiment, refractive index of the transparent material layer 14 is smaller than that of the transparent resin which is the base material of the wavelength converter 13. Referring to FIG. 16 shall explain how the light travels in a light-emitting device of the present embodiment. The primary light L1 generated by the light-emitting chip 12 reaches the fluorescent material 17 by transmitting the transparent material 14 and passing through the roughened inner surface 13b of the wavelength converter 13. As the inner surface 13b of the wavelength converter 13 is roughened in the light-emitting device of the present invention, the probability that the primary light L1 generated by the light-emitting chip 12 enters the wavelength converter 13 is high. In the light-emitting device of the present embodiment, by this composition, the wavelength-conversion efficiency of the light generated by the light-emitting chip 12 has been improved.

Figure 17:
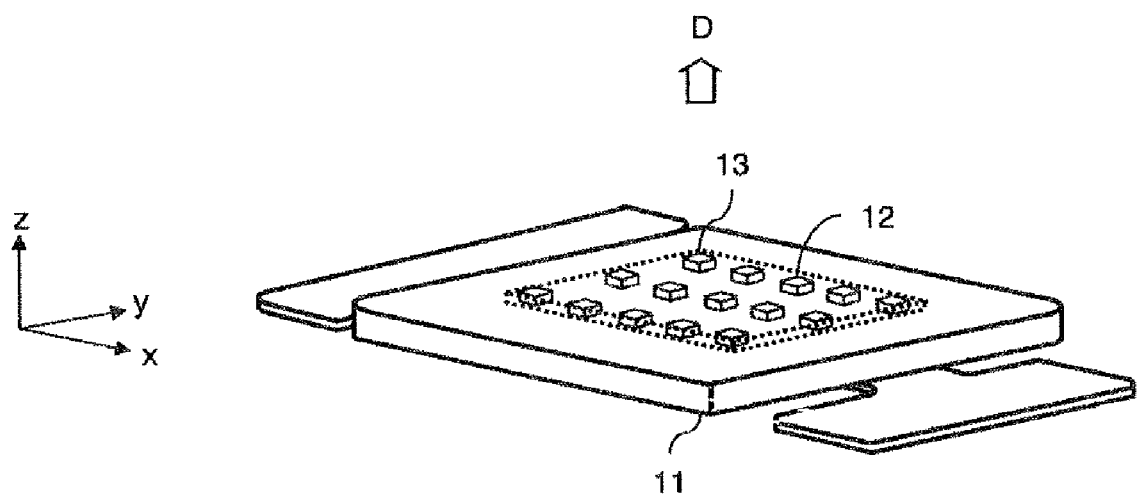
FIG. 17 is a perspective view illustrating another embodiment of a light-emitting device according to the present invention.
Figure 18:
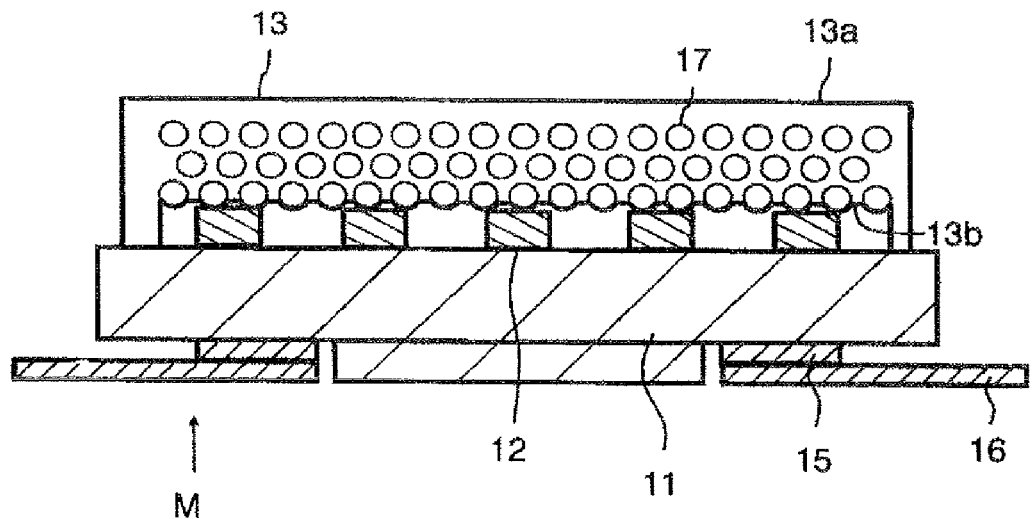
FIG. 18 is a sectional view of the light-emitting device illustrated in FIG. 17.

Referring to FIG. 17 and FIG. 18 shall explain another embodiment of a light-emitting device 2. In FIG. 17 the wavelength converter 13 is illustrated with a dotted line such that the inner structure of the light-emitting device can be seen through. The wavelength converter 13 is in contact with the light-emitting chip 12 and covers the light-emitting chip 12. That is, the roughened inner surface 13b of the wavelength converter 13 is in contact with the top surfaces of the light-emitting chips 12. In other words, the wavelength converter 13 covers a plurality of the light-emitting chips 12 mounted on the base 11.

Figure 19:
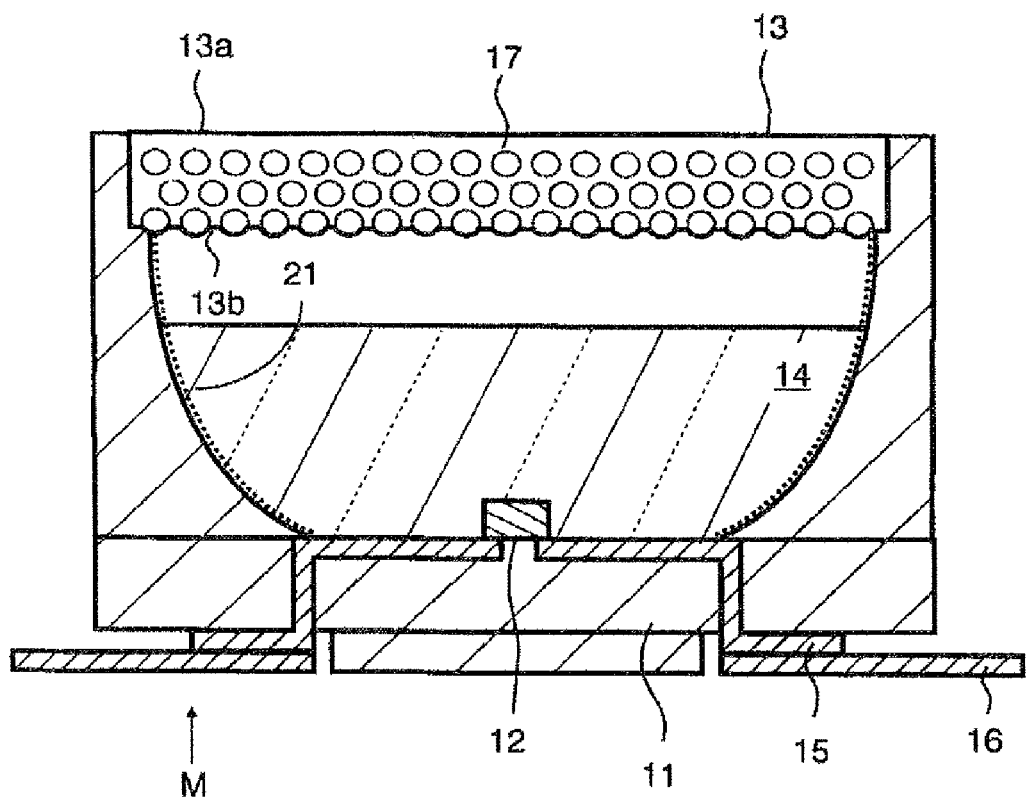
FIG. 19 is a sectional view illustrating another embodiment of a light-emitting device according to the present invention.
Figure 20:
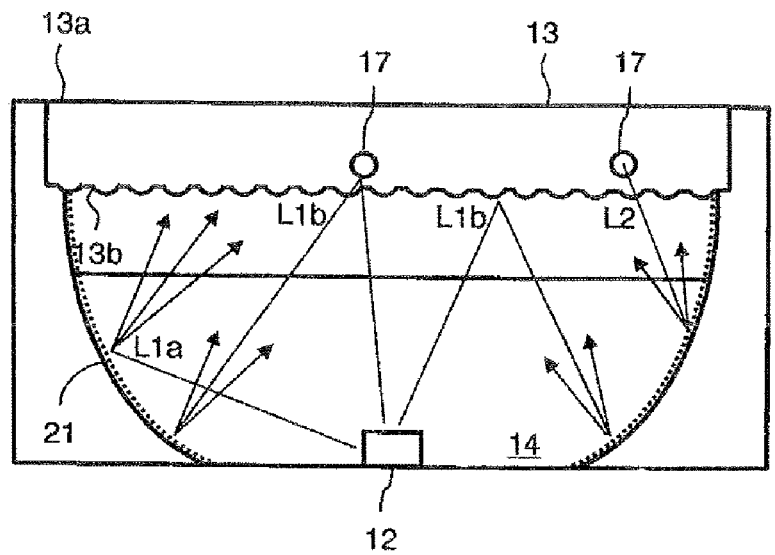
FIG. 20 is a schematic diagram illustrating how the light travels in the light-emitting device illustrated in FIG. 19.

Referring to FIG. 19 shall explain another embodiment of a light-emitting device 2. In the light-emitting device of the present embodiment, the difference from the structure of the light-emitting device illustrated in FIG. 2 is that the light-emitting device of the present embodiment further has a light reflecting surface 21 that has uneven surface texture and surrounds the light-emitting chip 12. In the present embodiment, the term, "surrounding the light-emitting chip 12" means that the light reflecting surface is disposed in the location where at least a part of the wavelength of the light generated by the light-emitting chip 12 reaches. The light reflecting surface 21 is roughened. Referring to FIG. 20 shall explain how the light travels in a light-emitting device illustrated in FIG. 19. In FIG. 20, the light-emitting chip 12 emits the primary light to the top and to the sides. The light reflecting surface 21 reflects the primary light L1a by scattering the primary light L1a which is generated by the light-emitting chip 12 and which reaches directly to the light reflecting surface 21. The primary light L1b generated by the light-emitting chip 12 reaches the wavelength converter 13 and is reflected downward (inside). Then, the light reflecting surface 21 reflects the primary light L1b by scattering the primary light L1b. The reflection of the primary light in the wavelength converter 13 comprises the reflection of the primary light on the inner surface 13b of the wavelength converter 13, and the reflection of the primary light on the surface of the fluorescent material 17 in the wavelength converter 13.

The fluorescent material 17 exited by the primary light emits the secondary light L2 downward (inside) as well as other direction. Then, the light reflecting surface 21 reflects the secondary light L2 and scatters the secondary light L2. As the light-emitting device in the present embodiment further has the light reflecting surface 21 with uneven surface texture, not only the wavelength-conversion efficiency in the fluorescent material 17 is improved, but also the light-emitting color is further improved. The light-emitting device in the present embodiment is provided with the inner surface 13b of the wavelength converter 13 where the secondary light L2 emitted from the fluorescent material 17 easily transmits. The secondary light L2 which has passed through the inner surface 13b of the wavelength converter 13 is scattered by the light reflecting surface 21. The scattered secondary lights L2 (such as red light, green light, and blue light) are mixed with each other in the space surrounded by the wavelength converter 13 and the light reflecting surface 21. In the space, the light mixed with each other (for example, white light) is emitted to the outside of the light-emitting device through the wavelength converter 13.

Figure 21A:
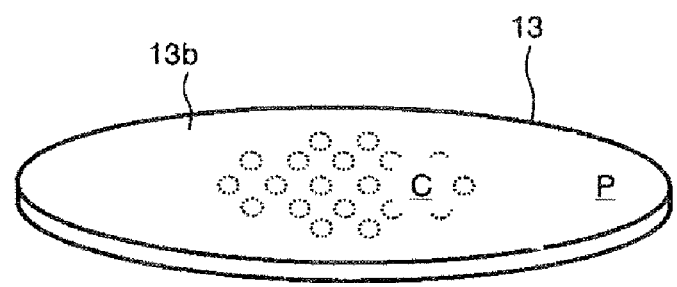
FIG. 21A and FIG. 21B are views illustrating other examples of a wavelength converter.
Figure 21B:
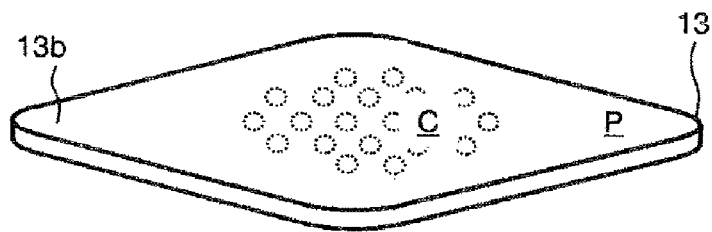

Referring to FIG. 21A and FIG. 21B shall explain another example of a wavelength converter 13. FIG. 21A illustrates another example of a circular wavelength converter 13. In this example, the center region C of the inner surface 13b in the wavelength converter 13 has rougher surface condition than the peripheral region P of the inner surface 13b. FIG. 21B illustrates another example of a tetragonal wavelength converter 13. In this example, the center region C of the inner surface 13b in the wavelength converter 13 has rougher surface condition than the peripheral region P of the inner surface 13b. The wavelength conversion efficiency of the light-emitting device with the wavelength converter 13 illustrated in FIG. 21A and FIG. 21B is improved at the position immediately above the light-emitting chip 12.

Figure 22:
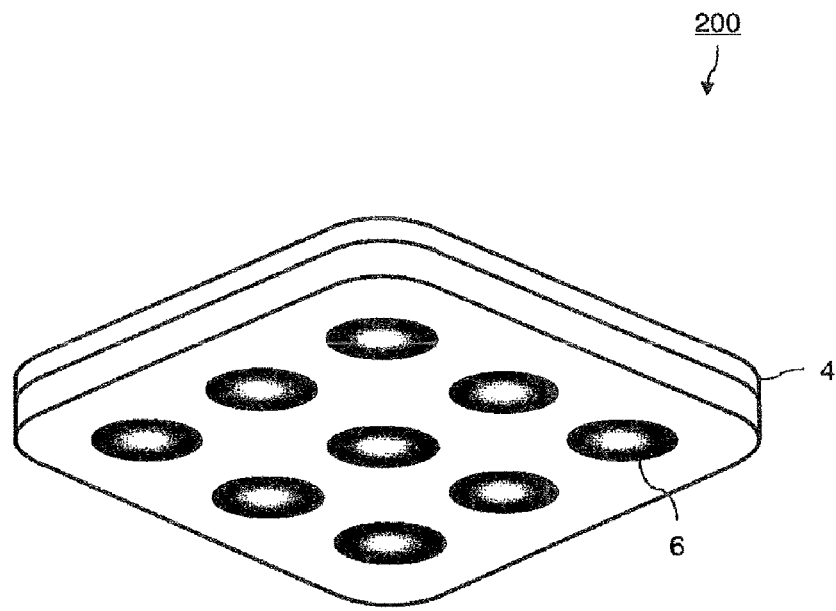
FIG. 22 is a perspective view illustrating another embodiment of an illuminating apparatus according to the present invention.
Figure 22:
Figure 23:
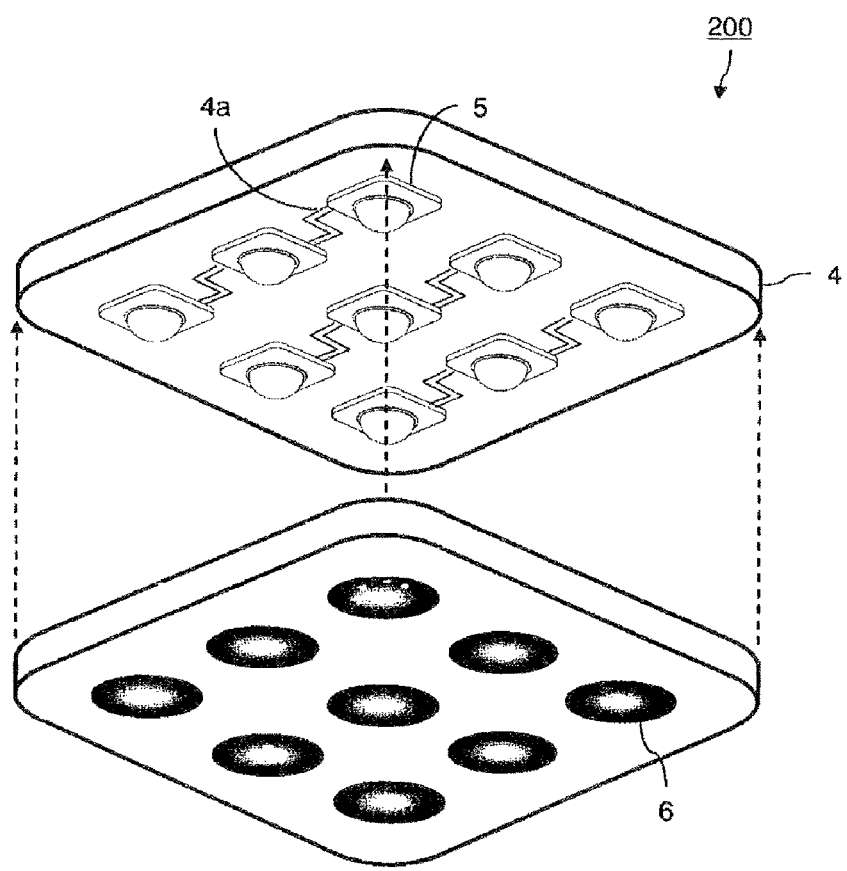
FIG. 23 is an exploded diagram of the illuminating apparatus illustrated in FIG. 22.

Referring to FIG. 22 and FIG. 23 shall explain another embodiment of an illuminating apparatus. An illuminating apparatus 200 in the present embodiment has a substrate 4, a plurality of light-emitting devices 5 mounted on the substrate 4, and a plurality of lenses 6 covering the plurality of light-emitting devices 5. In the present embodiment, the term, "covering the plurality of light-emitting devices 5" means that the plurality of lenses 6 is disposed in the location where at least a part of the wavelength of light generated by the plurality of light-emitting devices 5 reaches. The respective lenses 6 are installed so as to correspond to the respective light-emitting devices 5. The lens 6 is located immediately above the light-emitting device 5. The plurality of light-emitting devices 5 is arranged in planarity, and are electrically connected to a conductive pattern 4a formed on the substrate. In the present embodiment, the term, "being arranged in planarity" means that the plurality of light-emitting devices 5 is arranged two-dimensionally. The plurality of light-emitting devices 5 is arranged in a matrix-type on the substrate 4. The plurality of light-emitting devices 5 emits light corresponding to a driving electric power supplied by the conductive pattern 4a. The light generated by the plurality of light-emitting devices 5 is emitted toward the light-outputting direction L (downward in FIG. 18) by being diffused by the plurality of lenses 6.

Figure 24:
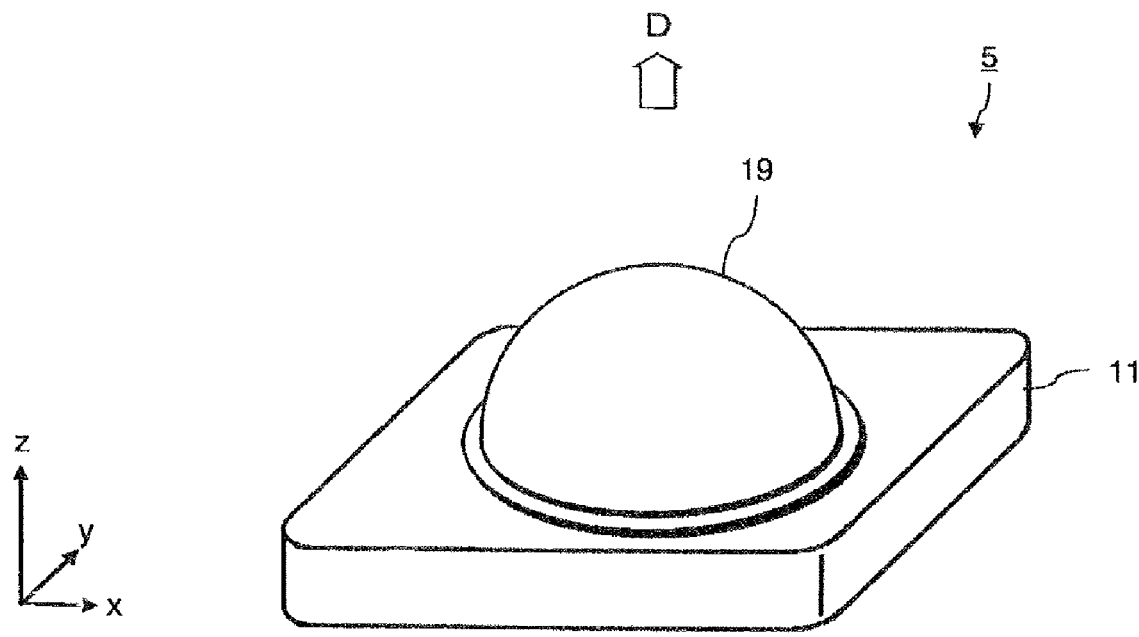
FIG. 24 is a perspective view of another embodiment of a light-emitting device according to the present invention.
Figure 25:
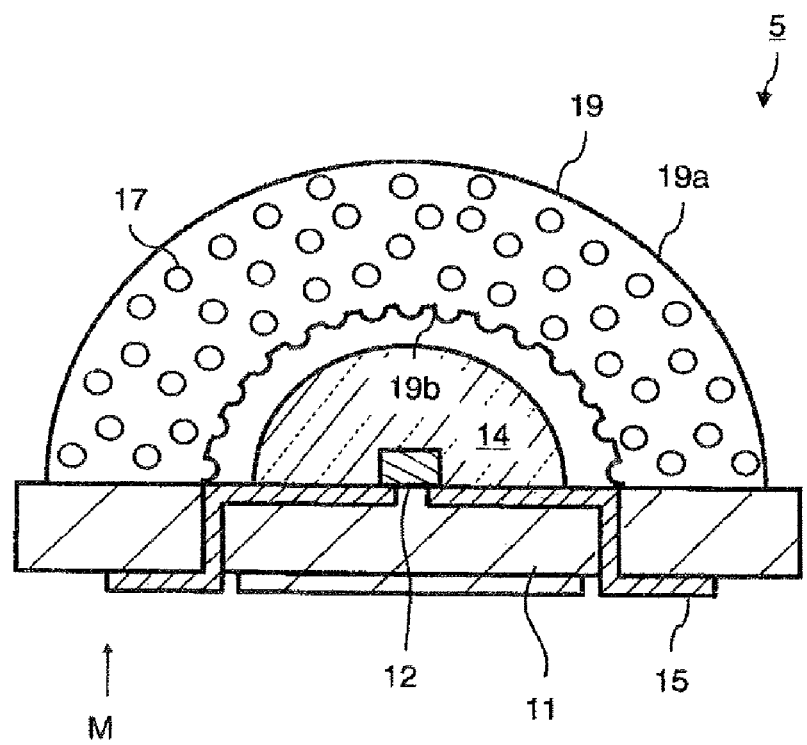
FIG. 25 is a sectional view of the light-emitting device illustrated in FIG. 24.

Referring to FIG. 24 and FIG. 25 shall explain the structure of the light-emitting device 5 in further details. In FIG. 24, the light-emitting device 5 is mounted on XY plane in virtual XYZ space. The light-emitting device 5 has a base 11, a light-emitting chip 12 mounted on the base 11, and a wavelength converter 19 covering the light-emitting chip 12. In the present embodiment, the term, "covering the light-emitting chip 12" means that the wavelength converter 19 is disposed in the location where at least a part of the light generated by the light-emitting chip 12 reaches. The wavelength converter 19 covers the sides and the top of the light-emitting chip 12. The light-emitting device 5 further has the transparent material layer 14 encapsulating the light-emitting chip 12. In the present embodiment, the term, "encapsulating the light-emitting chip 12" means that the transparent material layer 14 is adhered to at least a part of the surface of the light-emitting chip 12. Transparent material layer 14 is adhered to the sides and the top of the light-emitting chip 12. The transparent material layer 14 is optically connected with the light-emitting chip 12.

The light-emitting chip 12 is made of semiconductor material, and generates the primary light. The light-emitting chip 12 is mounted on the base 11 by flip-chip bonding, and is electrically connected to the conductive pattern 15 formed on the base 11. The wavelength converter 19 includes a fluorescent material 17 being excited by the primary light to emit secondary light. The inner surface 19b of the wavelength converter 19 is rougher than the outer surface 19a of the wavelength converter 19. The wavelength converter 19 is formed by pouring the translucent resin containing the fluorescent material 17 into a mold and hardening the transparent resin. The inner surface 19b of the wavelength converter 19 is roughened due to the surface texture of the mold. The wavelength converter 19 is apart from the light-emitting chip 12. In the present embodiment, the term, "being apart from the light-emitting chip 12" means that the wavelength converter 19 is arranged at intervals with the light-emitting chip 12, and there is a structure in which another member is interposed between the wavelength converter 19 and the light-emitting chip 12, and a structure in which another member is not interposed between the wavelength converter 19 and the light-emitting chip 12. In the structure illustrated in FIG. 25, the wavelength converter 19 is arranged at intervals with the light-emitting chip 12 by interposing the transparent material layer 14 between the wavelength converter 19 and the light-emitting chip 12. As the wavelength converter 19 is apart from the light-emitting chip 12, deviation of light-emitting strength distribution in the light-emitting device 5 is reduced. The wavelength converter 19 is composed of a transparent resin containing fluorescent material 17. The wavelength converter 19 is formed previously, in the form of a dome. The inner surface 19b of the wavelength converter 19 is apart from the surface of the transparent material layer 14. That is, there is a space between the wavelength converter 19 and the transparent material layer 14.

Figure 26:
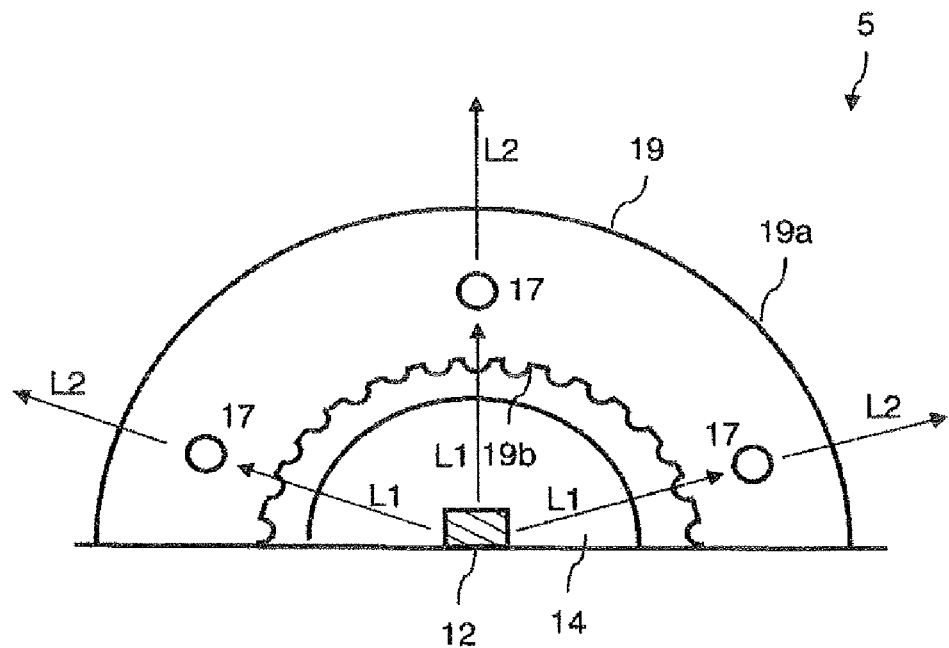
FIG. 26 is a schematic diagram illustrating how the light travels in the light-emitting device illustrated in FIG. 25.

Referring to FIG. 26 shall explain how the light travels in the light-emitting device 5 of the present embodiment. The primary light L1 generated by the light-emitting chip 12 is emitted to the wavelength converter 19 through the transparent material layer 14. The primary light L1 emitted to the wavelength converter 19 reaches the fluorescent material 17 through the roughened inner surface 13b of the wavelength converter 19. As the inner surface 19b of the wavelength converter 19 is roughened, the probability that the primary light L1 passes through the inner surface 19b is increased. The fluorescent material 17 emits the secondary light L2 with a wavelength different from the wavelength of the primary light by being excited by the primary light L1.

Figure 27:
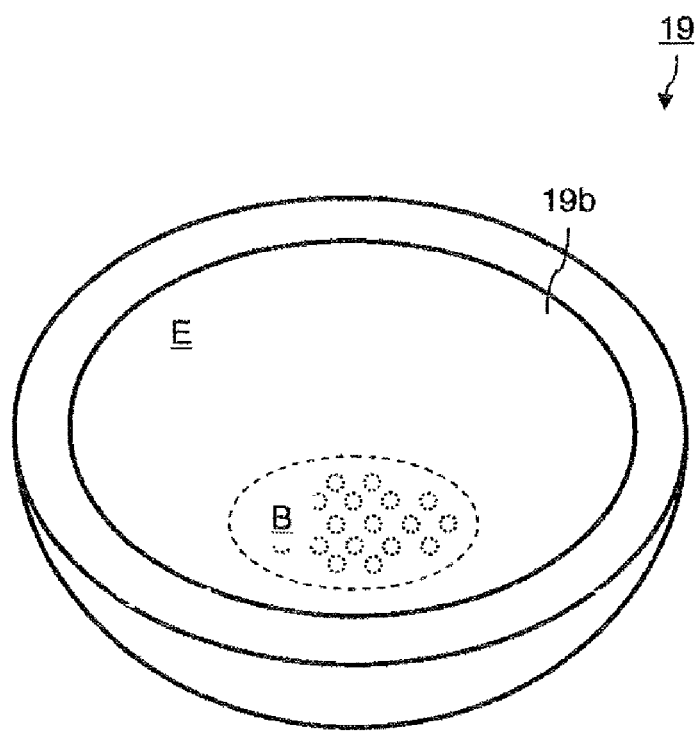
FIG. 27 illustrates another example of a wavelength converter.

Referring to FIG. 27 shall explain another example of a wavelength converter 19. FIG. 27 illustrates the surface condition of the inner surface 19b in the dome-shaped wavelength converter 19. In the example, the bottom portion B of the inner surface 19b in the wavelength converter 19 has rougher surface condition than the edge portion E of the inner surface 19b. The bottom portion B means the lower part of the inner surface 19b in the wavelength converter 19 illustrated in FIG. 27. The edge portion E means the upper part of the inner surface 19b in the wavelength converter 19 illustrated in FIG. 27. In the light-emitting device with the wavelength converter 19, the wavelength conversion efficiency is improved at the position immediately above the light-emitting chip 12.

Figure 28:
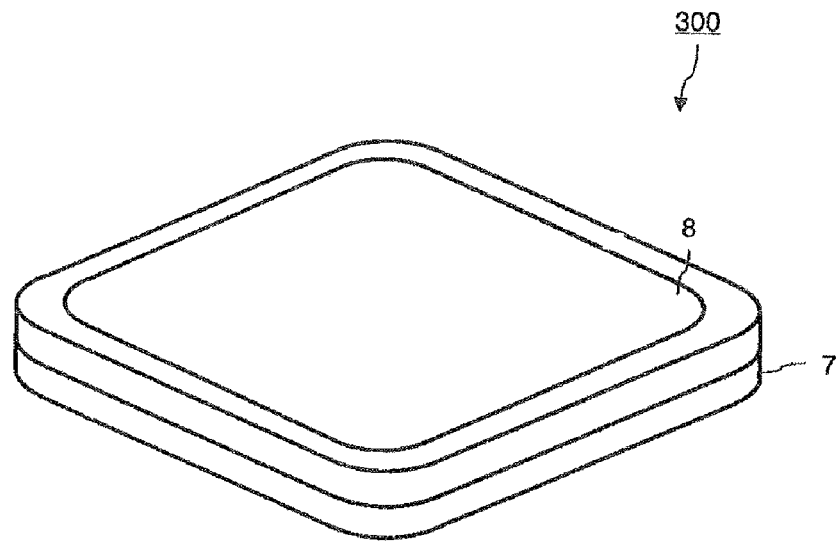
FIG. 28 is a perspective view for showing another embodiment of an illuminating apparatus according to the present invention.
Figure 29:
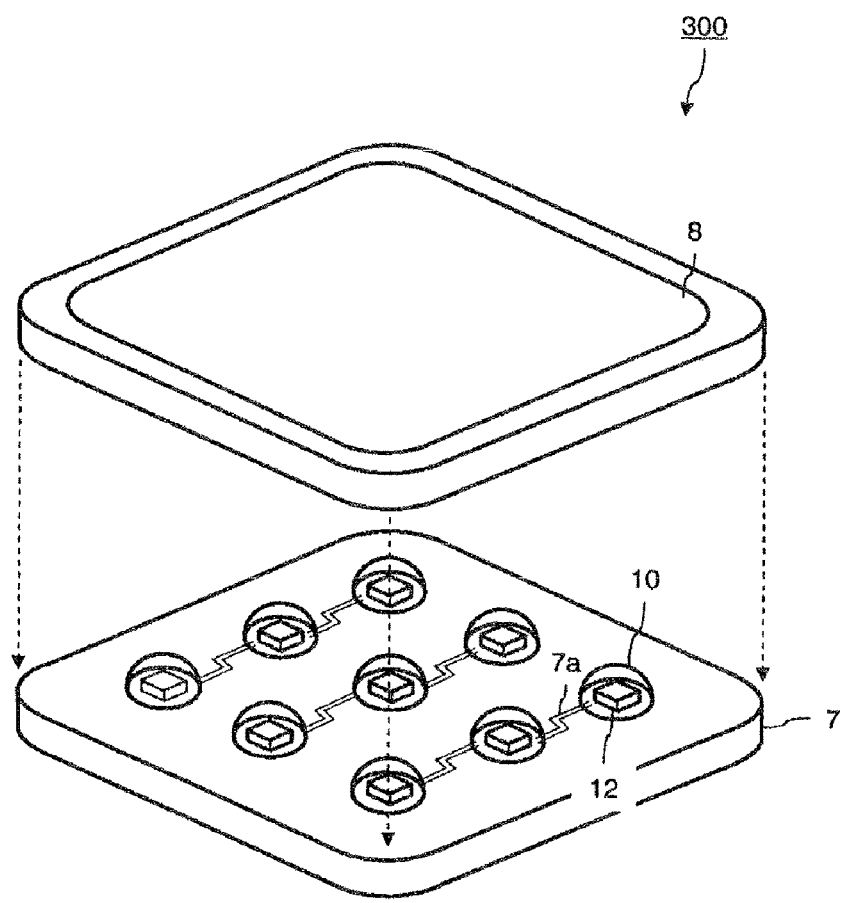
FIG. 29 is an exploded view of the illuminating apparatus illustrated in FIG. 28.
Figure 30:
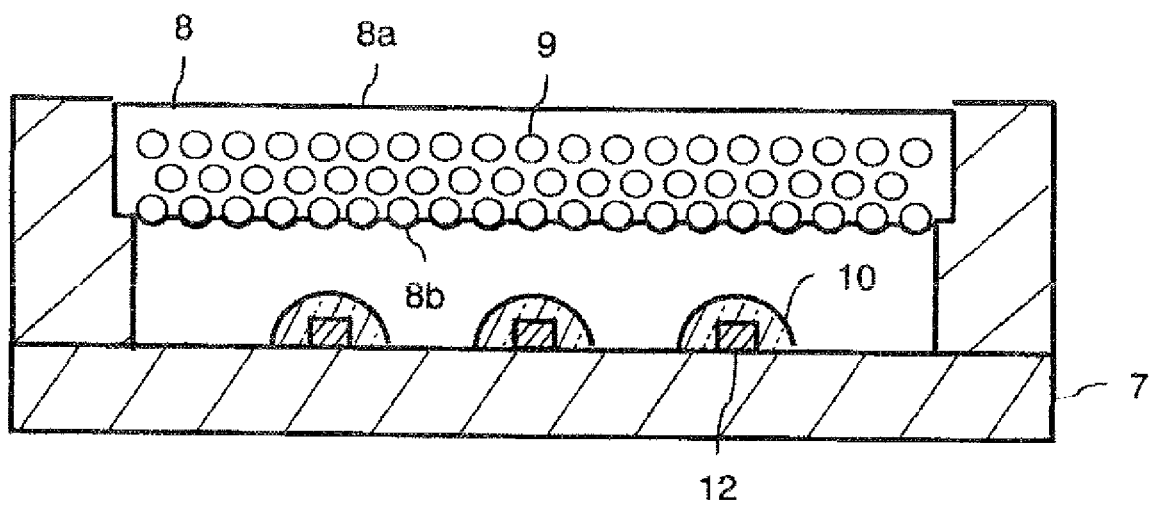
FIG. 30 is a sectional view of the illuminating apparatus illustrated in FIG. 29.

Referring to FIG. 28 through FIG. 30 shall explain another embodiment of an illuminating apparatus according to the present invention. An illuminating apparatus 300 in the present embodiment is provided with a substrate 7 having conductive pattern 7a, a light-emitting chip 12 electrically connected to the conductive pattern 7a, and a wavelength converter 8 covering the light-emitting chip 12. The illuminating apparatus 300 has a plurality of light-emitting chips 12 mounted on the substrate 7. The light-emitting chip 12 is made of semiconductor material, and generates the primary light. The wavelength converter 8 covers the plurality of light-emitting chips 12. In the present embodiment, the term, "covering the plurality of light-emitting chips 12" means that the wavelength converter 8 is disposed in the location where at least a part of the light generated by the plurality of the light-emitting chips 12 reaches. The wavelength converter 8 includes fluorescent material 9 being excited by the primary light to emit the secondary light, and has an outer surface 8A and an inner surface 8B. The inner surface 8B of the wavelength converter 8 has uneven surface texture. The inner surface 8B is rougher than the outer surface 8A. The illuminating apparatus 300 has a transparent material layer 10 encapsulating the light-emitting chip 12. In the present embodiment, transparency of the layer 10 means that at least a part of the wavelength of the primary light generated by the light-emitting chip 12 can be transmitted. The transparent material layer 10 is made of silicone resin, and is adhered to the sides and the top of the light-emitting chip 12. The plurality of transparent material layers 10 is located so as to correspond to the respective light-emitting chips 12 mounted on the substrate 7.

What is claimed as new and desired to be secured by Letters Patent of the United States is:

1. A light-emitting device comprising:
   a base;
   a light-emitting chip made of semiconductor material, mounted on the base, and configured to generate a primary light; and
   a light emitter having a first surface facing inward towards the light-emitting chip, and including a plurality of particles of fluorescent material configured to be excited by the primary light to emit a secondary light, wherein the first surface has a configuration outwardly bulged by shapes of inner-most particles of the plurality of particles of fluorescent material.

2. A light-emitting device according to claim 1, wherein the light emitter further has a second surface, the first surface is rougher than the second surface.

3. A light-emitting device according to claim 2, wherein the light emitter is apart from the light-emitting chip.

4. A light-emitting device according to claim 3, wherein the light emitter is made of resin containing the plurality of particles of fluorescent material.

5. A light-emitting device according to claim 4, wherein the resin is silicone with a specific gravity included within a range from 0.9 to 1.1.

6. A light-emitting device according to claim 5, wherein the plurality of particles of fluorescent material has a specific gravity included within a range from 3.8 to 5.1.

7. A light-emitting device according to claim 3, further comprising:
   a light reflecting surface surrounding the light-emitting chip and configured to scatter the primary light reflected by the light emitter.

8. A light-emitting device according to claim 7, wherein the light reflecting surface is configured to scatter the secondary light.

9. A light-emitting device according to claim 3, wherein the light emitter has a dome shape.

10. A light-emitting device according to claim 1, wherein the fluorescent material is distributed to be shifted to the first surface side of the light emitter.

11. A light-emitting device according to claim 1, further comprising:
    a transparent material layer encapsulating the light-emitting chip, and being apart from the first surface of the light emitter.

12. A light-emitting device according to claim 1, wherein the first surface of the light emitter is located in further inward than the inner-most particles of the plurality of particles of fluorescent material.

13. A light-emitting device according to claim 12, wherein the inner-most particles of the plurality of particles of fluorescent material emit at least a part of a wavelength range from 625 nm to 740 nm.

14. A light-emitting device according to claim 1,
    wherein the light emitter further comprises:
    a fluorescent material layer containing the plurality of particles of fluorescent material;
    a first transparent resin layer located in an inner surface side of the light emitter and including the first surface, the first transparent resin layer not containing particles of the plurality of particles of fluorescent material; and
    a second transparent resin layer located in an outer surface side of the light emitter such that the fluorescent material layer is in between the first transparent resin layer and the second transparent resin layer, the second transparent resin layer not containing particles of the plurality of particles of fluorescent material,
wherein a thickness of the first transparent resin layer is thinner than a thickness of the second transparent resin layer.

15. A light-emitting device according to claim 1, wherein the plurality of particles of fluorescent material of the light emitter is distributed to have a higher concentration of particles towards a first surface side of the light emitter than towards a second surface side of the light emitter.

16. An illuminating apparatus comprising:
a substrate with a conductive pattern;
a light-emitting chip made of semiconductor material, and connected electrically to the conductive pattern; and
a light emitter including a plurality of particles of fluorescent material, having a first surface facing inward towards the light-emitting chip, and covering the light-emitting chip, wherein the first surface has a configuration outwardly bulged by shapes of inner-most particles of the plurality of particles of fluorescent material.

17. An illuminating apparatus according to claim 16, further comprising:
a light reflector disposed in a location where light emitted outward from the light emitter reaches.

18. An illuminating apparatus according to claim 16, further comprising:
a lens covering the light emitter.

19. A light-emitting device comprising:
a light source configured to generate a primary light with a first wavelength; and
a wavelength-conversion means for converting the primary light with the first wavelength into a second wavelength different from the first wavelength, wherein the wavelength-conversion means includes a first surface facing inward towards the light source and a plurality of particles of fluorescent material, and wherein the first surface has a configuration outwardly bulged by shapes of inner-most particles of the plurality of particles of fluorescent material.

20. A light-emitting device according to claim 19, further comprising:
means for encapsulating the light source.

21. A light-emitting device according to claim 20, further comprising:
means for diffusing the primary light and emitting the primary light to the wavelength-conversion means.

* * * * *